United States Patent
Bradley et al.

(10) Patent No.: US 6,954,121 B2
(45) Date of Patent: Oct. 11, 2005

(54) METHOD FOR CONTROLLING PIEZOELECTRIC COUPLING COEFFICIENT IN FILM BULK ACOUSTIC RESONATORS AND APPARATUS EMBODYING THE METHOD

(75) Inventors: Paul D. Bradley, Mountain View, CA (US); Yury Oshmyansky, Camarillo, CA (US); Benjamin Yu, Sunnyvale, CA (US); John D. Larson, III, Palo Alto, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 99 days.

(21) Appl. No.: 10/457,737

(22) Filed: Jun. 9, 2003

(65) Prior Publication Data

US 2004/0246075 A1 Dec. 9, 2004

(51) Int. Cl.⁷ .............................. H03H 9/00
(52) U.S. Cl. ........................ 333/187; 333/133
(58) Field of Search .................. 333/187, 189, 333/133

(56) References Cited

U.S. PATENT DOCUMENTS

| | | | |
|---|---|---|---|
| 5,873,154 A | * 2/1999 | Ylilammi et al. | 29/25.35 |
| 6,081,171 A | * 6/2000 | Ella | 333/189 |
| 6,215,375 B1 | 4/2001 | Larson, III et al. | |
| 6,251,100 B1 | 6/2001 | Flock et al. | |
| 6,262,637 B1 | 7/2001 | Bradley et al. | |
| 6,384,697 B1 | * 5/2002 | Ruby | 333/189 |
| 6,407,649 B1 | * 6/2002 | Tikka et al. | 333/133 |
| 6,469,597 B2 | * 10/2002 | Ruby et al. | 333/187 |
| 6,472,954 B1 | 10/2002 | Ruby et al. | |
| 6,483,229 B2 | 11/2002 | Larson, III et al. | |
| 6,507,983 B1 | 1/2003 | Ruby et al. | |
| 6,550,664 B2 | 4/2003 | Bradley et al. | |
| 6,662,419 B2 | * 12/2003 | Wang et al. | 29/25.35 |
| 2002/0109563 A1 | 8/2002 | Bradley et al. | |
| 2002/0153965 A1 | 10/2002 | Ruby et al. | |

FOREIGN PATENT DOCUMENTS

| | | |
|---|---|---|
| JP | 55100722 | 7/1980 |
| JP | 07254836 | 10/1995 |

OTHER PUBLICATIONS

"Passband Filter Having an Asymmetrical Filter response." U.S. Appl. No. 09/783,773 filed Feb. 14, 2001, Now US 6462631 Oct. 8, 2002.

"Controlled Effective Coupling Coefficients for Film Bulk Acoustic Resonators." U.S. Appl. No. 09/841,234 filed Apr. 23, 2001, Now US 6472954 Oct. 29, 2002.

* cited by examiner

Primary Examiner—Michael Tokar
Assistant Examiner—Linh V Nguyen

(57) ABSTRACT

An apparatus such as a thin film resonator has a bottom electrode, a top electrode, and a composite layer between the two electrodes. The composite layer includes a piezoelectric (PZ) layer having a first coupling coefficient and a coupling coefficient control (CCC) layer having a second coupling coefficient. By varying the relative thicknesses of the PZ layer and the CCC layer during the manufacturing process, the coupling coefficient of the resonator can be established (to any value between the first coupling coefficient and the second coupling coefficient) with minimal impact on resonant frequency. Further, it is relatively less difficult to fabricate the PZ layer and the CCC layer having the desired coupling coefficient (as a combination of the first coupling coefficient and the second coupling coefficient) compared to the difficulties of fabrication of a uniform PZ layer having the desired coupling coefficient.

12 Claims, 4 Drawing Sheets

COMBINATION OF PROCESS FACTORS AFFECTING
ORDER WITHIN A PIEZOELECTRIC MATERIAL
(FOR EXAMPLE, ALUMINUM NITRIDE)

METHOD FOR CONTROLLING PIEZOELECTRIC COUPLING COEFFICIENT IN FILM BULK ACOUSTIC RESONATORS AND APPARATUS EMBODYING THE METHOD

BACKGROUND

The present invention relates to acoustic resonators, and more particularly, to resonators that may be used as filters for electronic circuits.

The need to reduce the cost and size of electronic equipment has led to a continuing need for ever-smaller electronic filter elements. Consumer electronics such as wireless telephones and miniature radios place severe limitations on both the size and the cost of the components contained therein. Further, many such devices utilize electronic filters that must be tuned to precise frequencies. Electronic filters allow those frequency components of electrical signals that lie within a desired frequency range to pass while eliminating or attenuating those frequency components that lie outside the desired frequency range. Such filters are referred to as bandpass filters.

One class of electronic filters that has the potential for meeting these needs is constructed from thin film bulk acoustic resonators (FBARS). These devices use bulk longitudinal acoustic waves in thin film piezoelectric (PZ) material. In one simple configuration, a layer of PZ material is sandwiched between two metal electrodes. The sandwich structure is preferably suspended in air. A sample configuration of an apparatus 10 having a resonator 20 (for example, an FBAR 20) is illustrated in FIGS. 1A and 1B. FIG. 1A illustrates a top view of the apparatus 10 while FIG. 1B illustrates a cut-away side view of the apparatus 10 along line A—A of FIG. 1A.

The resonator 20 is fabricated above a substrate 12. Deposited and etched on the substrate 12 are, in order, a bottom electrode layer 22, piezoelectric layer 24, and a top electrode layer 26. Portions (as indicated by brackets 20) of these layers that overlap and are fabricated over a cavity 14 constitute the resonator 20.

The electrodes 22 and 24 are conductors while the PZ layer 18 is typically piezoelectric material such as Aluminum Nitride (AlN).

When alternating current electric field is applied between the metal electrodes 22 and 26, the PZ layer 24 converts some of the electrical energy into mechanical energy in the form of mechanical waves. The mechanical waves propagate in the same direction as the electric field creating resonance at a particular resonant frequency. Ratio of the resulting mechanical energy to the electrical energy applied to the FBAR 20 is referred to as the coupling coefficient of the FBAR 20. Coupling coefficient of a resonator is determined, primarily, by the coupling coefficient of its PZ layer. Effective coupling coefficient is proportional to the intrinsic piezoelectric (a material constant) times a geometric term which is affected by thicknesses and locations of the different layers in the FBAR.

At the resonant frequency, the resonator 20 acts as an electronic resonator. The resonant frequency is determined by many factors including the total mass and thickness of the FBAR 20. Resonators for applications in the GHz range may be constructed with physical dimensions on the order of less than 100 microns in lateral extent 28 and a few microns in total thickness 29. In some implementation, for example, the resonator 20 is fabricated using known semiconductor fabrication processes and is combined with electronic components (not shown in the Figures) and other resonators (not shown in the Figures) to form electronic filters for electrical signals.

For a particular application of the FBAR 20, for example for 1 GHz to 2 GHz PCS bandpass filter applications for wireless communication devices, it is desirable to manufacture resonators having a particular desired coupling coefficient as well as having a particular desired resonant frequency.

Given the desired resonant frequency, one technique for achieving the desired coupling coefficient for a resonator is to select the PZ material, for its PZ layer, having coupling coefficient that is at or close to the desired coupling coefficient. For example, Aluminum Nitride (AlN), in a high quality crystalline form, has a coupling coefficient of approximately 6.5 percent. Accordingly, to manufacture a resonator having coupling coefficient of about 6.5 percent, the resonator can be fabricated with high quality AlN as its PZ layer.

However, this technique for achieving the desired coupling coefficient is not practical. This is because, at minimum, different PZ material needs to be discovered for each desired coupling coefficient value.

Another technique for achieving the desired coupling coefficient for a resonator is by varying the thickness of the PZ layer. For example, to realize a desired coupling coefficient of 3.7 percent for the FBAR 20, a thinner layer of high quality AlN can be deposited to form the PZ layer 24. Thinner PZ layer increases the resonant frequency of the FBAR 20. To maintain the desired resonant frequency, the electrode layers 22 and 26 need be made thicker to compensate for the loss of mass and thickness in the PZ layer 24.

Application of this technique for achieving the desired coupling coefficient results in resonators that are relatively more susceptible to frequency drift as temperature changes. This is because the electrodes 22 and 26 are made of material (such as, for example, Molybdenum) having a higher temperature coefficient than the PZ material (such as, for example, AlN). As the ratio of the mass of the electrodes to the mass of the PZ layer increases, the temperature coefficient of the resonator as a whole increases. Further, with a relatively thinner PZ layer, instances of undesirable electrostatic discharges (ESD) between the bottom electrode 22 and the top electrode 26 are increased compared to instances of such ESD for a resonator having a relatively thicker PZ layer.

Yet another technique for achieving the desired coupling coefficient is to reduce the quality of the PZ material. That is, to fabricate a resonator where the PZ material 24 has lower quality, or less order within its physical structure. For this reason, this technique can be called the "disordering technique." With the decrease in the order within the molecular structure of the material of the PZ layer 24, the piezoelectric characteristic of the PZ layer is reduced thereby reducing the coupling coefficient of the PZ layer 24. For example, to realize a desired coupling coefficient of 3.7 percent, a lower quality AlN can be deposited.

However, in the manufacturing process, it is difficult to control the degree of disorder, or quality, of the PZ material such as AlN and to consistently reproduce the exact degree of disorder to realize the desired coupling coefficient. This is because there are many factors that need be tightly controlled to consistently reproduce the exact degree of disorder. These factors include, for example, base temperature, gas pressure, contamination of various portions of the process equipment, humidity, sputter rate, chemical mixture ratio, deposition temperature, substrate roughness, vacuum quality, sputter chamber geometry, crystalline structure, sputter power, and many other factors not all of which are controllable or even known.

Further, the degree of disorder, thus the resulting coupling coefficient, is sensitive to small variations in process or manufacturing factors. Slight variations in any one or more of these factors in the manufacturing process results in widely varying degrees of disorder.

Consequently, there remains a need for an improved method for controlling piezoelectric coupling coefficient in film bulk acoustic resonators.

SUMMARY

The need is met by the present invention. Embodiments of the present invention provide an apparatus fabricated on a substrate, the apparatus having a bottom electrode, a composite layer on the bottom electrode, and a top electrode on the composite layer. The composite layer includes a piezoelectric layer having a first coupling coefficient and a coupling coefficient control layer having a second coupling coefficient.

Other embodiments of the present invention provide a method of fabricating an apparatus. First, a bottom electrode is fabricated on a substrate. Then, a composite layer is fabricated on the bottom electrode. Finally, a top electrode is fabricated above the composite layer. The composite layer includes a piezoelectric layer having a first coupling coefficient and a coupling coefficient control layer having a second coupling coefficient.

Other aspects and advantages of the present invention will become apparent from the following detailed description, taken in conjunction with the accompanying drawings, illustrating by way of example the principles of the invention.

DETAILED DESCRIPTION

Figure 1A:
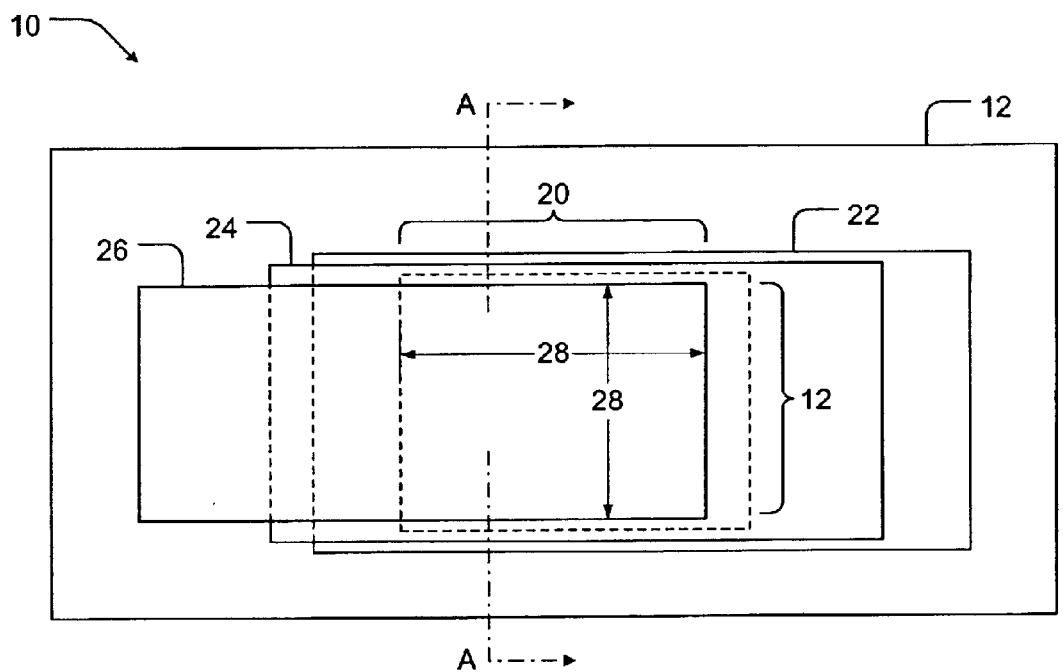
FIG. 1A is a top view of an apparatus including a resonator known in prior art.

The present invention will now be described with reference to the FIGS. 2 through 5, which illustrate various embodiments of the present invention. As illustrated in the Figures, the sizes of layers, regions, structure, or any combination of these are exaggerated for illustrative purposes and, thus, are provided to illustrate the general structures of the present invention.

Various aspects of the present invention are described with reference to a device having a layer, a region, or a structure being formed on or above a substrate or other layers, regions, or structures. As will be appreciated by those of skill in the art, references to a layer, a region, or a structure being formed "on" or "above" another layer, another region, another structure, or a substrate contemplate that additional layers may intervene. References to a layer, a region, or a structure being formed on or above another layer, another region, another structure, or a substrate without an intervening layer are described herein as being formed "directly on" or "directly above" the other layer, the other region, the other structure, or the substrate.

Furthermore, relative terms such as "under" or "beneath" may be used herein to describe one layer, region, or structure's relationship to another layer, region, or another as illustrated in the Figures. It will be understood that these terms are intended to encompass different orientations of the device in addition to the orientation depicted in the Figures. For example, if the device in the Figures is turned over, layers, regions, or structure described as "under" or "beneath" the other layer, region, or structure would now be oriented "over" or "above" these other layers, regions, or structures. As such, the terms "under" or "beneath" are intended to encompass both over and above depending upon orientation of the Figures, context, or both in such situations. Likewise, the terms "over" or "above" are intended to encompass both under and beneath depending upon orientation of the Figures, context, or both in such situations. Like numbers refer to like elements throughout.

As shown in the figures for the purposes of illustration, one embodiment of the present invention is exemplified by an apparatus, for example a resonator, fabricated on a substrate. The apparatus includes a bottom electrode and a top electrode sandwiching a composite layer. The composite layer includes a piezoelectric (PZ) layer having a first coupling coefficient and a coupling coefficient control (CCC) layer having a second coupling coefficient.

Material for the PZ layer is selected such that the coupling coefficient of the PZ layer can be tightly controlled with relative ease during the manufacturing process. For example, the PZ layer can be fabricated using high quality AlN having a coupling coefficient of approximately 6.5 percent. Material for the CCC layer is selected such that the CCC layer has no or negligible electrical and thermal conductivity and has a coupling coefficient that can be tightly controlled with relative ease during the manufacturing process. For example, the CCC layer can be Aluminum Oxy-Nitride (AlNOx), $AlN_xO_{1-x}$ where x can range from 0.95 to 0.99. That Aluminum Oxy-Nitride material has no coupling coefficient or close to zero coupling coefficient. Alternatively, the CCC layer 34b can include any suitable dielectric layer such as, for example only, quartz, sapphire, diamond, silicon carbide, or Rutile (TiO2) or other dielectric material having the desired properties. The desired properties include, without limitation, for example, low temperature coefficient, no or near zero coupling coefficient (that is, non-dielectric), strong bonds, and relatively ease with which the material can be deposited and fabricated for a desired coupling coefficient.

In the present invention, the desired coupling coefficient is realized by varying relative thickness of the PZ layer and the CCC layer while maintaining the total thickness of the composite layer. Using this technique, the coupling coefficient can be adjusted while maintaining the total thickness of the composite layer, thus the resonant frequency, relatively constant.

Figure 2:
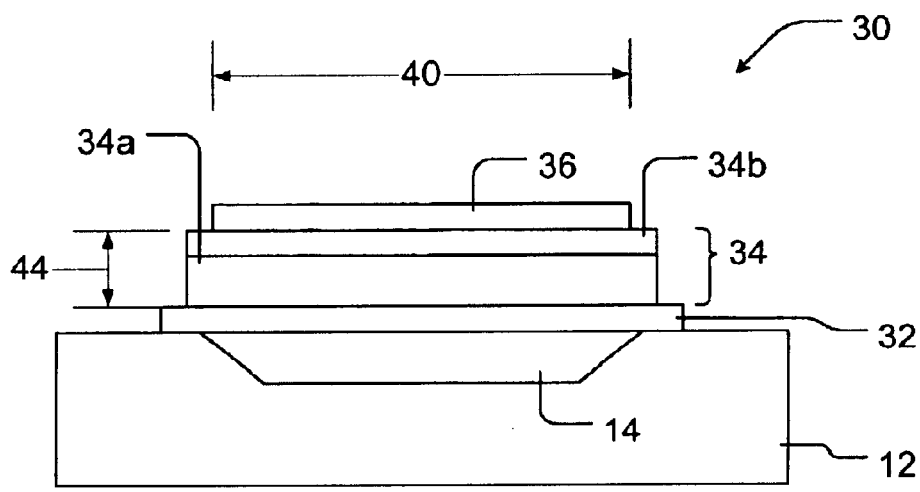
FIG. 2 is a cut-away side view of an apparatus according to a first embodiment of the present invention.

FIG. 2 is a cut-away side view of an apparatus according to one embodiment of the present invention. The apparatus 30 can be, for example, a resonator such as an FBAR as discussed above. The FBAR 30 is fabricated on a substrate 12 by depositing, or fabricating, the illustrated layers. The substrate can be any suitable substrate such as a Silicon substrate 12.

On the substrate 12, a bottom electrode 32 is deposited. The bottom electrode 32 can be fabricated using conducting material such as Molybdenum. Various fabrication methods and deposition techniques are known in the art to deposit the bottom electrode 32 on the substrate 12. Thickness of the bottom electrode depends on various factors such as, for example, the desired size of the FBAR 30 and the desired resonant frequency. For a resonator a resonant frequency in the order of GHz for application in wireless communication devices, the bottom electrode 32 may have a thickness ranging in the order of thousands of angstroms, for example one to five thousand angstroms.

In the present invention, the desired coupling coefficient (for example, 3.7 percent) for the FBAR 30 is realized by fabricating a composite layer 34 between the bottom electrode 32 and a top electrode 38. The composite layer 34 includes a piezoelectric (PZ) layer 34a having a first coupling coefficient (for example, approximately 6.5 percent) and a coupling coefficient control (CCC) layer 34b having a second coupling coefficient (for example, approximately zero percent). The coupling coefficient for the resonator 30 is a combination of the coupling coefficients of the PZ layer 34a and the CCC layer 34b. By adjusting relative thicknesses of these two layers within the composite layer, the desired coupling coefficient (for example, 3.7 percent) for the FBAR 30 can be realized.

One desirable result of this invention is that any desirable coupling coefficient (for example 3.7 percent) that falls within the first coupling coefficient (for example 6.5 percent) and the second coupling coefficient (for example 0.0 percent) can be realized by adjusting relative thicknesses of these two layers within the composite layer 34. Accordingly, the shortcomings of the prior art techniques are overcome.

For one, there is no need to discover and fabricate a different PZ material for each value of the desired coupling coefficient. Further, the total thickness of the composite layer 34 is maintained while the coupling coefficient for the FBAR 30 is adjusted. Accordingly, the mass, or the thickness, of the electrodes 32 and 36 need not be increased. As a consequence, the temperature coefficient is not increased, and the frequency draft due to high temperatures is minimized.

Figure 1B:
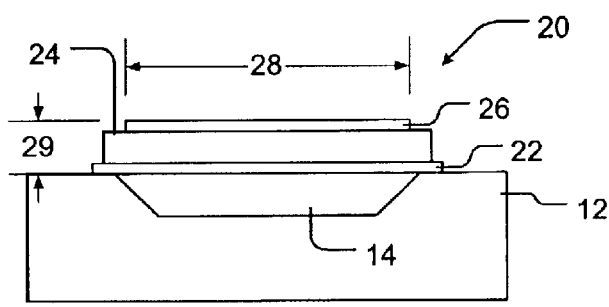
FIG. 1B is a cut-away side view of the apparatus of FIG. 1A cut along line A—A.

Finally, the composite layer 34 having the desired coupling frequency, as combined, is less difficult to fabricate than the PZ layer 24 of FIG. 1 having the desired coupling frequency as a result of application of the prior art disordering technique.

Figure 3:
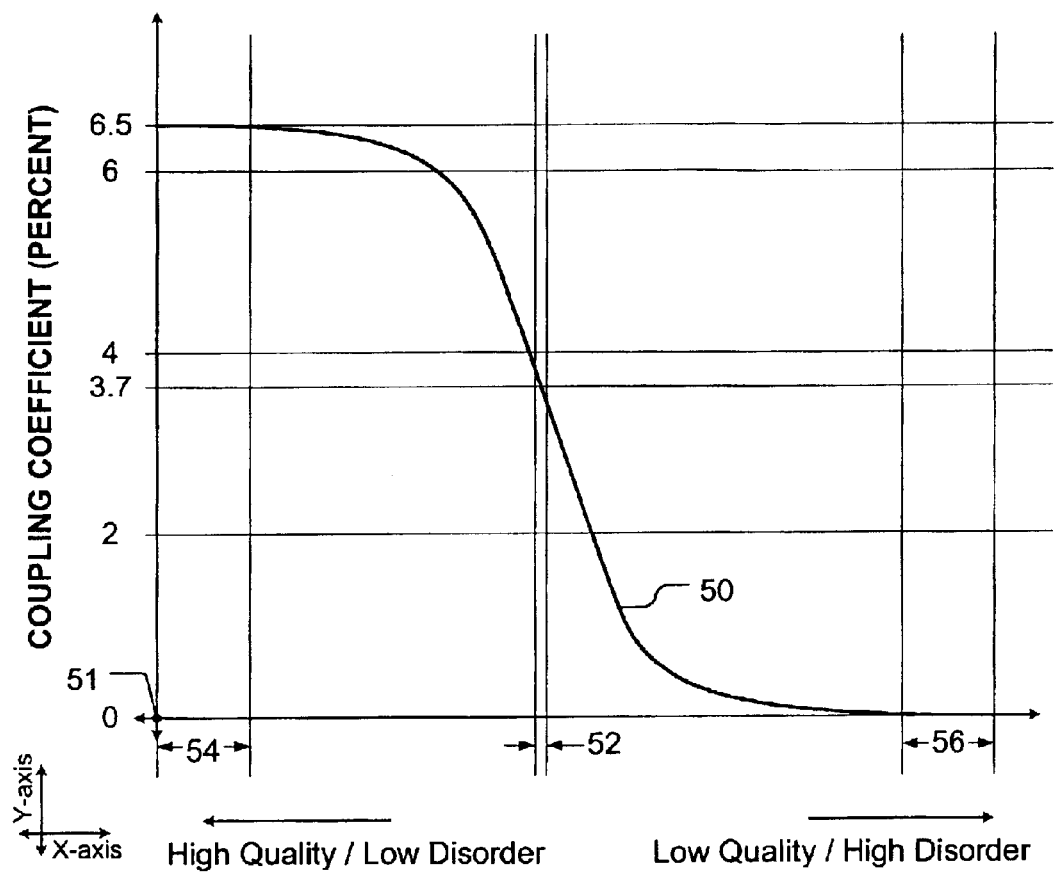
FIG. 3 is a graph illustrating relationships between process factors and resultant coupling coefficients.

FIG. 3 is a graph illustrating a relationship curve 50 between process factors and resultant coupling coefficient of a sample PZ material such as Aluminum Nitride (AlN). Referring to FIG. 3, the X-axis represents a combination of various manufacturing process factors leading to increase or decrease in order (of its physical structure) within a sample PZ material such as AlN. On the X-axis, movement away from the origin 51 of the graph indicates increases in disorder (decreases in order) of the crystalline quality of the material thereby resulting in a lower quality layer. Movement toward the origin 51 on the X-axis indicates decreases in disorder (increases in order) of the crystalline quality of the material thereby resulting in a higher quality layer. The Y-axis represents the resulting coupling coefficient in percent.

The graph of FIG. 3 illustrates the difficulties of achieving an arbitrary desired coupling coefficient by controlling process factors. For example, to fabricate a PZ layer of AlN material having the desired coupling coefficient of, for example, at or near 3.7 percent, the process factors (represented by the X-axis) need be controlled within a very narrow range 52. This is difficult and expensive to accomplish in practice. These factors include, for example, base temperature, gas pressure, contamination of various portions of the process equipment, humidity, sputter rate, chemical mixture ratio, deposition temperature, substrate roughness, vacuum quality, sputter chamber geometry, crystalline structure, sputter power, and many other factors not all of which are controllable or even known. As indicated by the relationship curve 50, slight variations in the process factors at or near the narrow range 52 results in AlN having a coupling coefficient that is significantly different than the desired coupling coefficient of 3.7 percent.

On the other hand, it is relatively easy to fabricate a PZ layer of, for example, AlN, at the coupling coefficient of at or near 6.5 percent. Aluminum Nitride, when deposited in a high quality crystalline form, has intrinsic coupling coefficient of approximately 6.5 percent. Further, the high quality AlN can be fabricated within a relatively wide range 54 of process factors. That is, relatively large variations in the process factors at or near the wide range 54 do not have significant impact on the coupling coefficient of the resulting PZ layer.

Likewise, it is relatively easy to fabricate a CCC layer of, for example, Aluminum Oxy-Nitride (AlNOx) material, at the coupling coefficient of at or near 0.0 percent. Aluminum Oxy-Nitride, $AlN_xO_{1-x}$, where x can range from 0.95 to 0.99, is a low quality, oxygenated form of the Aluminum Nitride, and has a coupling coefficient of near zero percent. Further, the AlNOx can be fabricated within a relatively wide range 56 of process factors. That is, relatively large variations in the process factors at or near the wide range 56 do not have significant impact on the coupling coefficient of the resulting CCC layer. In testing, AlNOx having two to five percent oxygen resulted in useful CCC layer having near zero coupling coefficient.

Referring again to FIG. 2, various techniques for depositing and fabricating, individually, the PZ layer 34a and the CCC layer 34b are known in the art and need not be discussed here. In some embodiments, for example, the resonator 30 is fabricated using known semiconductor fabrication processes and is combined with electronic components (not shown in the Figures) and other resonators (not shown in the Figures) to form electronic filters for electrical signals.

Lateral size 40 of the FBAR 30 can be within a range in the order of microns to millimeters depending on various factors such as, for example, the desired resonant frequency and the process used for fabrication of the FBAR 30. Resonators for applications in the GHz range may be constructed with physical dimensions on the order of less than 100 microns in lateral extent 40 and a few microns in total thickness 44. In such an embodiment, the composite layer 34 can range in the order of fractions of microns to microns, for example only, 0.74 micron. The relative proportion of the PZ layer 34a and the CCC layer 34b within the composite layer 34 depends on the desired coupling coefficient of the resonator 30.

In fact, the present inventive technique can be combined with one or more of the prior art techniques. For example, to reduce the coupling coefficient of the FABR 30 to the desired level of 3.7 percent, the thickness of the electrodes 32 and 36 can be slightly increased and the thickness 44 of the composite layer 34 can be slightly decreased to realize 5.4 percent coupling coefficient for the resonator 30 (assuming that the composite layer 54 includes only high quality AlN material). In this embodiment, the electrodes 32 and 34 are approximately 3,700 angstroms thick, each, and the composite layer 34 (of all AlN material) is approximately 7,400 angstroms thick.

Then, to realize 3.7 percent coupling coefficient, the composite layer 34 is fabricated having 10 percent AlNOx and 90 percent AlN by thickness, the total composite layer thickness remaining approximately 7,400 angstroms thick.

Figure 4:
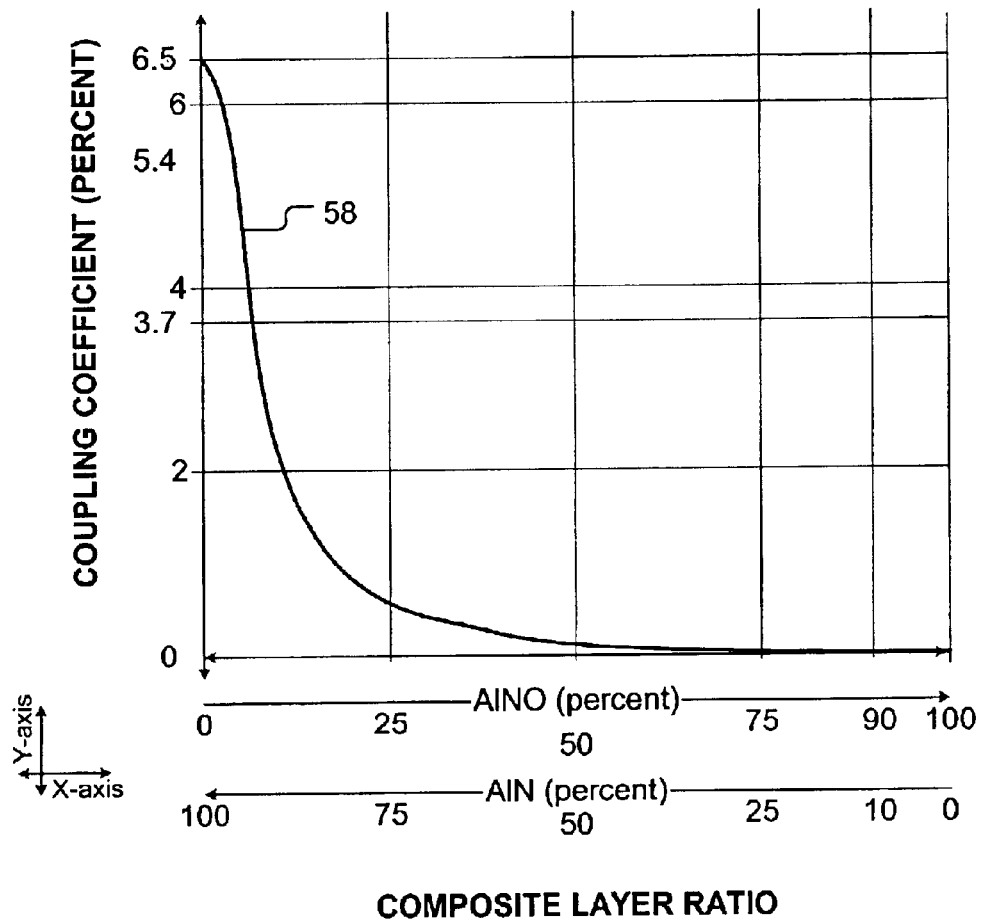
FIG. 4 is a graph illustrating relationships between composite layer proportion and resulting coupling coefficient.

FIG. 4 is a graph illustrating a composite layer ratio curve 58. Referring to FIGS. 2 and 4, the X-axis represents percentage of the PZ layer 34a (AlN in the present example) and the CCC layer 34b (AlNO$_x$ in the present example) making up the composite layer 34, in percent. The Y-axis represents the resulting coupling coefficient of the composite layer 34. The relationship between the disorder (thus the coupling coefficient for the composite layer) and the percent of the composite layer is not necessarily linear.

As would be expected, when the composite layer is 100 percent AlN, the resulting coupling coefficient for the composite layer 34 is approximately 6.5 percent. Likewise, when the composite layer is 100 percent AlNOx, the resulting coupling coefficient for the composite layer 34 is at or close to zero percent. When the relative thickness of the PZ layer 34a and the CCC layer 34b is varied, the coupling coefficient for the composite layer 34 varies. The ratio curve 58 is a sample curve only used to illustrate one possible relationship between the ratio of the materials within the composite layer 34 when the composite layer 34 includes AlN and AlNOx as discussed in the present example. The ratio curve 58 can vary widely depending on many factors including, but not limited to, the material used, relative sizes and thickness within the resonator 30, and numerous other process factors already listed above. In addition, reactions or cross diffuse of material between the PZ layer 34a and the CCC layer 34b can further affect and distort the ratio curve 58.

Referring again to FIG. 2, finally, the top electrode 36 is deposited. The top electrode 36 can be fabricated using conducting material such as Molybdenum. Various fabrication methods and deposition techniques are known in the art to deposit the top electrode 36 on the substrate 12. Thickness of the top electrode depends on various factors such as, for example, the desired size of the FBAR 30 and the desired resonant frequency. For a resonator a resonant frequency in the order of GHz for application in wireless communication devices, the bottom electrode may have a thickness ranging in the order of thousands of angstroms, for example one to five thousand angstroms. The resonator 30 can be fabricated over a cavity 14.

Figure 5:
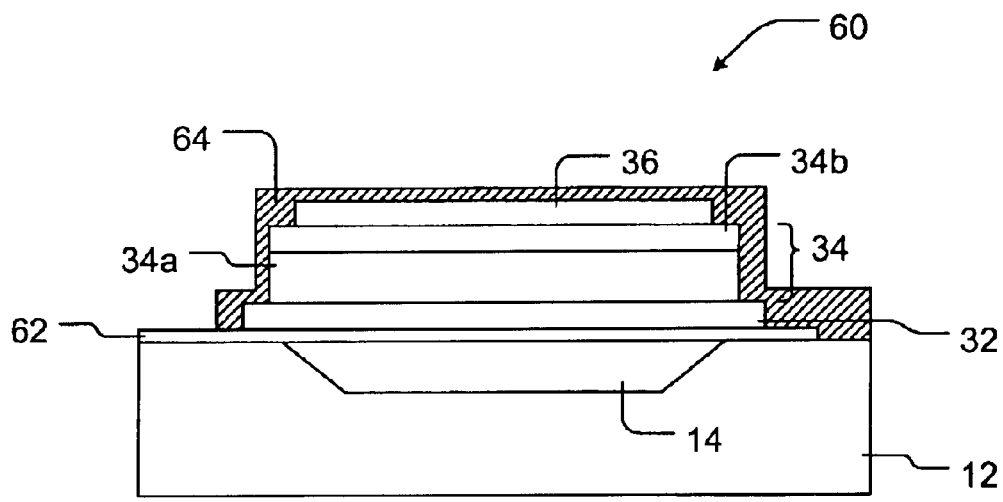
FIG. 5 is a cut-away side view of an apparatus according to a second embodiment of the present invention.

FIG. 5 is a cut-away side view of an apparatus 60 according to another embodiment of the present invention. Portions of the apparatus 60 are similar to corresponding portions of the apparatus 30 of FIG. 2. For convenience, portions of the apparatus 60 which are similar to the corresponding portions of the apparatus 30 of FIG. 2 are assigned the same reference numbers. Different portions are assigned different reference numbers.

Referring to FIG. 5, the resonator 60 is fabricated by depositing a seed layer 62 before the deposition of the bottom electrode 32. The seed layer 62 provides a better surface on which the bottom electrode 32 and the composite layer 34 can be fabricated. Following the fabrication of the top electrode 36, a passivation layer 64 can be fabricated to protect and passivation the resonator 60. Both the seed layer 62 and the passivation layer 64 can be deposited using AlN or other materials such as Alumina ($Al2O3$), silicon (Si), silicon nitride ($Si3N4$), or silicon dioxide ($SiO2$). In fact, for the passivation layer 64, any non-reactive dielectric material not attacked by HydroFluoric Acid and having a low temperature coefficient can be used.

Thickness of the seed layer 62 can be within a range in the order of hundreds of angstroms depending on various factors such as, for example, the desired resonant frequency and the process used for fabrication of the FBAR 60. For the resonator 60 having a resonant frequency in the GHz range of the present example, the seed layer 62 can be approximately 300 angstroms thick. Thickness of the passivation layer 64 can be within a range in the order of thousands of angstroms depending on various factors such as, for example, the desired resonant frequency and the process used for fabrication of the FBAR 60. For the resonator 60 having a resonant frequency in the GHz range of the present example, the passivation layer 64 can be approximately 3,000 angstroms thick.

From the foregoing, it will be appreciated that the present invention is novel and offers advantages over the current art. Although a specific embodiment of the invention is described and illustrated above, the invention is not to be limited to the specific forms or arrangements of parts so described and illustrated. The invention is limited by the claims that follow. Furthermore, only those claims specifically reciting "means for" or "step for" should be construed in the manner required under the sixth paragraph of 35 U.S.C. section 112.

What is claimed is:

1. An apparatus fabricated on a substrate, the apparatus comprising:
   a bottom electrode;
   a composite layer on said bottom electrode, said composite layer comprising
      a piezoelectric layer having a first coupling coefficient said piezoelectric layer including Aluminum Nitride;
      a coupling coefficient control layer having a second coupling coefficient, said coupling coefficient control layer including Aluminum Oxy-Nitride; and
   a top electrode above said composite layer.

2. The apparatus recited in claim 1 wherein said coupling coefficient control layer comprises a non-piezoelectric dielectric material.

3. The apparatus recited in claim 1 further comprising a seed layer under said bottom electrode.

4. The apparatus recited in claim 1 further comprising a passivation layer over said top electrode.

5. The apparatus recited in claim 1 wherein said bottom electrode comprises Molybdenum.

6. The apparatus recited in claim 1 wherein the apparatus is fabricated over a cavity.

7. A method of fabricating an apparatus, the method comprising:
   fabricating a bottom electrode on a substrate;
   fabricating a composite layer on said bottom electrode, said composite layer comprising
      a piezoelectric layer having a first coupling coefficient said piezoelectric layer including Aluminum Nitride;

a coupling coefficient control layer having a second coupling coefficient, said coupling coefficient control layer including Aluminum Oxy-Nitride; and fabricating a top electrode above said composite layer.

8. The method recited in claim 7 wherein said coupling coefficient control layer comprises a non-piezoelectric dielectric material.

9. The method recited in claim 7 further comprising a step of fabricating a seed layer under said bottom electrode.

10. The method recited in claim 7 further comprising a step of fabricating a passivation layer over said top electrode.

11. The method recited in claim 7 wherein said bottom electrode comprises Molybdenum.

12. The method recited in claim 7 wherein the apparatus is fabricated over a cavity.

* * * * *